HETEROJUNCTION SURFACE CHANNEL TRANSISTORS

Filed Dec. 26, 1963

INVENTOR
FRANK F. FANG

BY John F. Ohlandt Jr.

ATTORNEY

3,263,095
HETEROJUNCTION SURFACE CHANNEL TRANSISTORS

Frank F. Fang, Yorktown Heights, N.Y., assignor to International Business Machines Corporation, New York, N.Y., a corporation of New York Filed Dec. 26, 1963, Ser. No. 333,435
14 Claims. (Cl. 307—88.5)

This invention relates to semiconductor devices and, more particularly, to a novel surface channel field effect type of transistor and to a technique for its fabrication.

The field effect transistor may be described as a majority carrier device because of the fact that the "working current" is defined by carriers which are normally in excess in the principal region of conduction, that is, either by means of electrons in an n conductivity region, or by means of holes in a p conductivity region. This contrasts radically with the more conventional ambipolar transistor, of NPN or PNP type, wherein current flow is chiefly dependent on the movement of minority carriers, that is, those carriers which are opposite in sign to those normally in excess in the base region of such ambipolar transistor. A detailed description of a unipolar device may be had by referring to an article by W. Shockley, "A Unipolar 'Field Effect' Transistor," in the Proceedings of the IRE, November 1952, pages 1365–1376. Also, reference may be made to an article by W. Shockley and G. L. Pearson, "Modulation of Conduction of Thin Films of Semiconductors by Surface Charges," Physical Review, volume 74, pages 232 through 233.

The device described in the first cited article above by W. Shockley is operated such that majority carriers flow between a source electrode at one end of the semiconductor body and a drain electrode at the other end. A pn junction is formed in the conducting filament between source and drain electrodes, and a control or gate signal is applied to this pn junction to modulate the bulk channel which exists between the source and drain electrodes. The thickness of a depletion layer associated with the pn junction is modified by the use of the gate or control electrode. If the reverse bias voltage is high enough, the depletion layer becomes so thick as to pinch off the current path through the bulk channel between the source and drain electrodes.

The present invention is distinguished from the aforesaid unipolar device described in the W. Shockley article in that the device of the present invention relies on the fact that the surface potential of a semiconductor body can be controlled by an external field and, additionally, relies on the fact that under certain conditions the surface conductivity type can be inverted from the bulk. Thus, if the bulk is of p conductivity type, for example, the surface would be of n conductivity type. The conductivity of this inversion layer, serving as a surface channel, is modulated in accordance with an applied signal so as to affect the conductance of the channel and hence, to affect the current flow between source and drain electrodes.

Accordingly, it is a primary object of the present invention to provide a novel surface channel, field effect device.

Another object is to create a well-defined conduction channel at the surface of a semiconductor substrate.

A further object is to control the surface potential of a semiconductor substrate by means of an external field.

A still further object is to provide suitable contacts to the surface channel such that the bulk conduction is eliminated and the operating current of the device is completely controlled by a heterojunction field electrode.

Yet another object is to provide a planar, field effect device wherein electrical contact to the device is made entirely in one plane.

Another object is to provide an amplifying or switching field effect device.

The above objects are fulfilled essentially by the formation of a heterojunction at the surface of a semiconductor substrate so as to provide an inversion layer which serves to define the conduction channel at said surface. Since the heterojunction itself is a single crystal entity, there are negligible interface states in the surface channel defined by the aforesaid inversion layer.

Heterojunctions, per se, are well known and a description of them may be obtained by referring to the IBM Journal of Research and Development, vol. 4, 1960, pages 283–287. In particular, as is brought out in the IBM Journal article, a Ge-GaAs heterojunction, even though of the same conductivity type throughout, has potential barriers due to the band edge discontinuities. It is this property that makes it possible to have two-dimensional, three-way homo-heterojunctions. A unique kind of surface channel transistor can thus be realized.

Although reference has been made, and will be made hereinafter to a Ge-GaAs heterojunction, it should be borne in mind that other suitable semiconductors having appropriately matched lattice parameters may be utilized to take special advantage of their unique capabilities following the basic teaching disclosed herein.

The foregoing and other objects, features and advantages of the invention will be apparent from the following more particular description of preferred embodiments of the invention, as illustrated in the accompanying drawings.

Figure 1A:
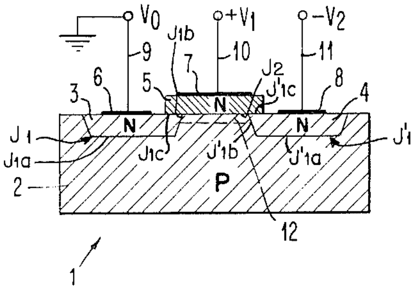
FIGURE 1A is a cross-sectional view of one embodiment of a heterojunction surface channel transistor according to the present invention.

Referring now to FIGURE 1A, there is shown a semiconductor device, generally designated by the numeral 1, comprised of the semiconductor body 2 of predetermined conductivity type. In this particular instance the body 2 is of germanium and of p conductivity type by reason on the inclusion of a typical impurity such as gallium. On the top surface of the semiconductor body 2, spaced regions 3 and 4 of n conductivity type are shown and these regions serve as the source and drain contacts for the field effect device 1. The spaced regions 3 and 4 are created, by diffusing an n type impurity, such as arsenic, into the top surface of the semiconductor body 2 by the use of a mask on that surface. It will be understood of course, that other well-known techniques for forming these regions, such as vapor growth, may be employed. With formation of the spaced regions 3 and 4, an NPN filament has been produced which serves as the essential conduction medium.

A further region 5, which overlays the aforesaid top surface of the body 2, is composed of a semiconductor material of a different band gap from the material of body 2. The material of region 5 is one that is compatible with the semiconductor material of body 2 and which can be grown epitaxially, for example, from the vapor phase, on the body 2. In the present example, the material of region 5 is selected to be gallium arsenide which has such lattice parameters that it can be grown in epitaxial relationship with the germanium body 2. Region 5 thus constitutes a monocrystalline extension of the monocrystalline body 2.

Following construction of the monocrystalline heterojunction above described, ohmic contacts 6, 7 and 8 are made to the respective regions 3, 5 and 4, and electrical leads 9, 10 and 11 are shown attached to the aforesaid contacts 6, 7 and 8. A plurality of variable potential sources $V_0$, $+V_1$, and $-V_2$ are shown schematically and these potential sources are connected to their respective electrical leads 9, 10 and 11.

The region 5 of gallium arsenide, which has been epitaxially grown on the top surface of the body 2 so as to contact the bulk of the body 2 of p conductivity type and also to contact the source and drain regions 3 and 4, serves as the gate or control element in the device of FIGURE 1A.

Layer 12 which is shown immediately beneath the region 5, by means of a dotted line within the p conductivity bulk, is a layer which is produced due to the fact that the region 5 of gallium arsenide is in contact with the p conductivity bulk of germanium. The modulation of the conductivity of this inversion layer will be explained hereinafter. It is due to the fact that the conductivity of this inversion layer can be modified by application of a gate or control signal that permits control of the source to drain conductance.

It will be clear that when the device of FIGURE 1A is biased as shown, that is, by application of the potentials $V_0$, $+V_1$ and $-V_2$ to their respective contacts 6, 7 and 8, all of the junctions between the semiconductor material, germanium, and the compatible semiconductor material, gallium arsenide, are reverse biased. The space charge condition of the NPN filament near the interface is such that the n type germanium of source and drain regions 3 and 4 is accumulated and the p type germanium of body 2 is depleted. Since the doping level of the p type germanium is slightly less than that of the gallium arsenide, most of the space charge region of the pn heterojunction defined by region 5 in contact with region 2 is in the region 2 of germanium.

In FIGURE 1A, the symbol $J_1$ stands for the junction that is defined by source region 3 in contact with the other regions of the structure. Thus, we can consider $J_{1a}$ as that portion of the junction $J_1$ defined by region 3 in contact with the p conductivity bulk of semiconductor body 2. Similarly, $J'_1$ represents the junction defined by drain region 4 in contact with the other regions of the structure, $J'_{1a}$ being the portion defined by regions 4 and 2. The symbol $J_2$ represents the junction defined by region 5 in contact with the p conductivity bulk of region 2. $J_{1b}$ denotes the contact between region 3 and the inversion layer 12 and $J_{1c}$ between region 3 and region 5; similarly $J'_{1b}$ and $J'_{1c}$ denote corresponding portions of junction $J'_1$.

The operation of the device of FIGURE 1A will now be described in connection with the energy band diagrams of FIGURES 2A, 2B, 3 and 4. Application of a suitable bias voltage as indicated above will alter the inversion layer 12 in the p type germanium near the interface of regions 5 and 2. With the alteration of this inversion layer 12, the complete ohmic conductance channel from the source region 3 to the drain region 4 is modified. This ohmic path is established because the material therein is all of the same conductivity type, in this case, all of n conductivity type.

Figures 2A, 2B:
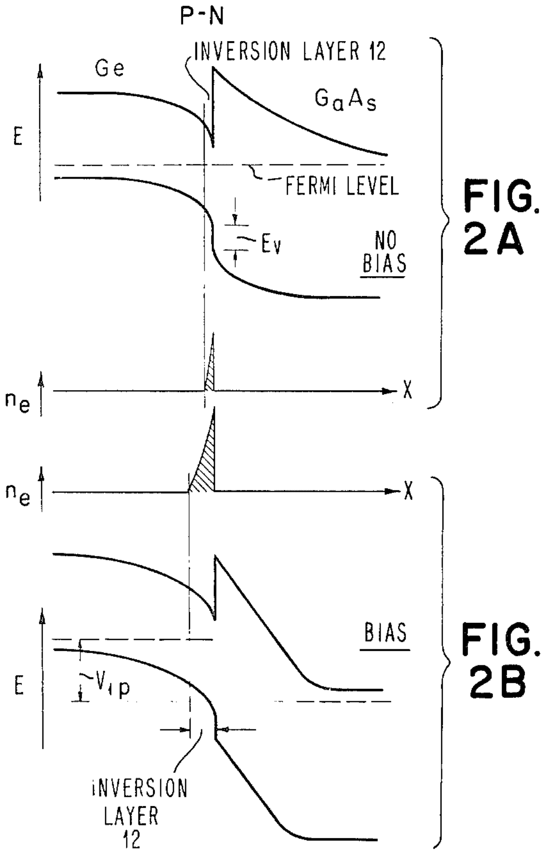
FIGURES 2A and 2B depict the energy band diagrams for the pn heterojunction formed by the gate or control electrode, with no bias and with bias, respectively, and correlated charge distribution diagrams for the two bias conditions.
Figure 3:
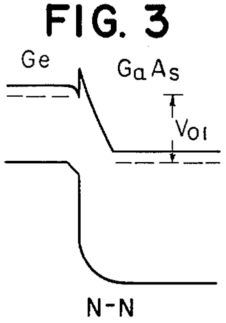
FIGURE 3 is an energy band diagram for the n-n heterojunctions formed between the gate and source, and gate and drain, contacts under bias conditions.

The nature of the electric conduction in this channel is governed by majority carriers, in this example, electrons. This can be appreciated by reference to the energy band diagrams. In FIGURE 2A, there is depicted the situation for the pn heterojunction $J_2$, that is, between the region 5 of gallium arsenide and the region 2 of germanium, with no bias applied to the gate (region 5). In order to create the desired inversion layer 12, it is necessary to calculate the relative doping concentrations on both sides of the heterojunction $J_2$. This is done by the use of the following expressions:

$$V_{A0}+V_{B0}+\frac{\Delta E_v}{q}=\frac{E_{gB}}{q} \quad (1)$$

$$\frac{V_{A0}}{V_{B0}}=\frac{K_B N_B}{K_A N_A} \quad (2)$$

$$V_{A0}\geq\frac{1}{2}E_{gA} \quad (3)$$

where $V_{A0}$ is the built-in voltage in semiconductor A forming region 2; $V_{B0}$ is the built-in voltage in semiconductor B forming region 5; $\Delta E_v$ is the valence band discontinuity; $E_{gA}$ and $E_{gB}$ represent the band gaps for semiconductors A and B. Also, $K_A$ and $K_B$ are the respective dielectric constants for the materials A and B; $N_A$ and $N_B$ are the doping levels for the respective semiconductors.

Combining the above expressions results in the final expression for relative doping:

$$\frac{N_A}{N_B}<\frac{K_B}{K_A}\frac{(2E_{gB}-E_{gA}-2\Delta E_V)}{E_{gB}} \quad (4)$$

For the particular case considered, that is, the germanium and gallium arsenide system, where germanium is semiconductor A, this gives the ratio of doping concentration as approximately 2.0. Thus, for the particular example cited, namely the germanium and gallium arsenide system, one wants $N_{Ge}\leqq 2N_{GaAs}$ to create the desired inversion layer.

Referring now to FIGURE 2B, the situation here depicted is for the same heterojunction as shown in FIGURE 2A but with bias applied to the gate region, that is, to region 5, of the device of FIGURE 1A. It will be seen, particularly by reference to the correlated charge distribution diagram immediately above the energy band diagram in FIGURE 2B, that the inversion layer 12 has been enhanced and the charge distribution has changed such that the conductivity of the inversion layer 12 has been substantially altered. This follows from the well-known expression for conductivity: $\sigma=n_e q\mu$ where $n_e$ is carrier density; $q$ is the electron charge; $\mu$ is mobility; and, $\omega$ is the thickness of inversion layer 12. The total conductance of the channel is given by $G=aq\mu\int_0^\infty n_e dx$ where $a$ is a geometric constant and $x$ is distance measured from the heterojunction interface into region 2. The voltage $V_{1p}$ in FIGURE 2B represents the potential difference between region 5 which has a potential of $+V_1$ and the floating potential of region 2 of conductivity type.

The reason that the inversion layer 12 has been produced in the device of FIGURE 1A is due to the nature of the heterojunction which involves a band edge discontinuity. Thus, as one looks from left to right in the diagrams of FIGURES 2A and 2B, it will be seen that the Fermi level is at first close to the valence band but, as the interface is approached, the Fermi level then appears to be equidistant between the valence and conduction bands and thereafter it appears closer to the conduction band, at a point very near to the interface. The energy band diagram in the case of n-n heterojunctions, that is, the ones between the source and gate and between the drain and gate which have been previously designated as $J_{1c}$ and $J'_{1c}$, is depicted in FIGURE 3 and, again, the situation is made clear that this is like an ordinary reverse biased Schottky barrier, where the voltage $V_{01}$ is the specific potential difference between the source and gate. The n-n heterojunctions will always be reverse biased under normal operation conditions.

Figure 4:
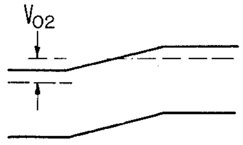
FIGURE 4 is an energy band diagram for the surface conduction channel between the source and drain contacts under bias conditions.

In FIGURE 4, there is depicted the energy band diagram for the surface channel itself, that is, for the complete ohmic path from the source region 3 through the inversion layer 12 of n conductivity type to the drain region 4. There is, of course, a slight change in the levels of the valence and conduction bands due to the fact that there is an applied bias voltage $V_{02}$, which corresponds to the difference between $V_0$ and $-V_2$.

In the consideration of the operation of the device of FIGURE 1A, the description was referenced to the initial formation of an inversion layer of very slight thickness under the condition of no applied bias (see FIGURE 2A), and with the consequent enhancement of the inversion layer by the application of a potential $+V_1$. However, it will be understood that the device of the present invention can be constructed, by suitable choice of the relative doping in the several regions, such that the inversion layer can be established to have a much greater degree of inversion under no bias conditions. In the latter case, then, the channel would initially be much more conductive than has been depicted in FIGURE 1A. In either case, that is, whether the inversion layer involves a slight or a very great degree of inversion, the device can be operated as either a switch or an amplifier by suitably adjusting the operating point by use of appropriate gate biasing.

Figure 1B:
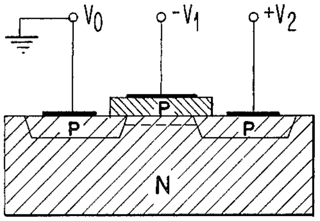
FIGURE 1B is a cross-sectional view of another embodiment of a heterojunction surface channel transistor, but illustrating the opposite polarity structure, or complementary form, to that of FIGURE 1A.

It will also be appreciated that, although the foregoing description has been confined to the electron majority carrier device of FIGURE 1A, that is, a device wherein electrons are the majority carriers, the opposite polarity configuration can be realized, as depicted in FIGURE 1B. In the case of FIGURE 1B, of course, the various potentials have been suitably modified to reflect the differences in conductivity type.

It will also be understood that although the device of the present invention has been illustrated with respect to the formation of the gate or control contact as involving the deposition of the semiconductor material gallium arsenide on a substrate of germanium, the roles of these materials can be reversed, that is to say, the semiconductor substrate can be selected to be of gallium arsenide, and, after formation of the spaced contacts an epitaxial layer of germanium can be formed on top surface of the selected substrate.

What has been disclosed herein is a unique surface channel field effect semiconductor device which advantageously exploits the peculiar characteristics of heterojunction structures. With the device of the present invention the formation of an insulator is not involved in the gate construction and only moderate gate voltages are required for proper operation. Additionally, the device of the present invention can be made planar in geometry, which is an essential capability for integrated circuit application. Further, the availability of complementary forms of the device makes it possible to perform logic without using other, passive, elements. This is an important factor for reliable integrated circuitry. Also, as has been emphasized before, since the heterojunction is a single crystal entity there are negligible interface states in the surface channel.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A heterojunction surface channel device comprising a monocrystalline semiconductor body constituted of a first semiconductor material having a first band gap and being of predetermined conductivity type, two spaced regions of opposite conductivity-type on one surface of said semiconductor body, a third monocrystalline region of a second different semiconductor material having a second wider band gap and being of opposite conductivity type on said one surface intermediate said two spaced regions; and defining with said body a heterojunction whereby an inversion layer is created at the interface and contacting said two spaced regions to define an ohmic conduction channel therebetween.

2. A heterojunction surface channel device comprising a monocrystalline semiconductor body constituted of a first semiconductor material having a first band gap and being of predetermined conductivity type, two spaced regions of opposite conductivity-type on one surface of said semiconductor body, a third monocrystalline region of a second different semiconductor material having a second wider band gap and being of opposite conductivity type on said one surface intermediate said two spaced regions and defining with said body a heterojunction whereby an inversion layer is created at the interface and contacting said two spaced regions to define an ohmic conduction channel therebetween, ohmic contacts to said two spaced regions and to said third region, means for applying bias potentials to each of said ohmic contacts so that a flow of majority carriers is produced in said conduction channel and is controlled by said biasing potentials applied at said third region serving as a gate.

3. The device as defined in claim 2 wherein said third monocrystalline region is constituted of gallium arsenide and said monocrystalline semiconductor body is constituted of germanium.

4. A device as defined in claim 2 wherein said first semiconductor material is of p conductivity type and said two spaced regions and said third region are of n conductivity type.

5. A device as defined in claim 2 wherein said first semiconductor material is of n conductivity type and said two spaced regions and said third region are of p conductivity type.

6. The device as defined in claim 2 wherein the doping level of said semiconductor body is less than the doping level of said third region.

7. A device as defined in claim 2 wherein said inversion layer is created by virtue of the relative doping concentrations between said semiconductor body and said third region, said relative doping concentrations being determined by the expression:

$$\frac{N_A}{N_B} < \frac{K_B}{K_A} \frac{(2E_{gB} - E_{gA} - 2\Delta E_v)}{E_{gA}}$$

where $N_A$ and $N_B$ are the respective doping levels of said semiconductor body and said third region, $K_A$ and $K_B$ are the respective dielectric constants of said semiconductor body and said third region, $E_{gA}$ and $E_{gB}$ are the respective band gaps of said semiconductor body and said third region, and $\Delta E_v$ is the valence band discontinuity.

8. A heterojunction surface channel transistor comprising a monocrystalline semiconductor body constituted of a first semiconductor material having a first band gap and being of predetermined conductivity type, two spaced regions of opposite conductivity type on one surface of said body, a third monocrystalline region of a second different semiconductor material having a band gap greater than said first band gap and being of opposite conductivity type to said body, said third region overlaying said one surface of said body intermediate said two spaced regions and defining with said body a heterojunction whereby an inversion layer is created at the interface between said first and second semiconductor materials, said inversion layer contacting said two spaced regions so as to define an ohmic conduction path therebetween, biasing means connected to said two spaced regions to cause current flow in said ohmic conduction path, means for modulating the conductivity of said conduction path by the application of a biasing signal to said third region.

9. The transistor as defined in claim 8 wherein said third monocrystalline region is constituted of gallium arsenide and said monocrystalline semiconductor body is constituted of germanium.

10. The transistor as defined in claim 8 wherein said first semiconductor material is of p conductivity type and said two spaced regions and said third region are of n conductivity type.

11. A transistor as defined in claim 8 wherein said first semiconductor material is of n conductivity type and said two spaced regions and said third region are of p conductivity type.

12. A process of fabricating a heterojunction surface channel device comprising the steps of:

providing a semiconductor body constituted of a first semiconductor material having a first band gap and being of predetermined conductivity type, forming two spaced contacts of opposite conductivity-type at one surface of said semiconductor body, forming a third monocrystalline region of second different semiconductor material having a second wider band gap and being of opposite conductivity-type on said one surface of said body intermediate said two spaced contacts and defining with said body a heterojunction whereby an inversion layer is created at the interface of said first and second semiconductor materials to define a conduction channel between said two spaced contacts.

13. A process of fabricating a heterojunction surface channel device comprising the steps of:

providing a semiconductor body constituted of a first semiconductor material having a first band gap and being of predetermined conductivity-type, forming two spaced contacts of opposite conductivity-type by diffusing impurities into one surface of said semiconductor body, forming a third monocrystalline region of second different semiconductor material having a second wider band gap and being of opposite conductivity-type on said one surface of said body intermediate said two spaced contacts and defining with said body a heterojunction whereby an inversion layer is created at the interface of said first and second semiconductor materials to define a conduction channel between said two spaced contacts.

14. A process of fabricating a heterojunction surface channel device comprising the steps of:

providing a semiconductor body constituted of a first semiconductor material having a first band gap and being of predetermined conductivity type, forming two spaced contacts of opposite conductivity type by diffusing impurities into one surface of said semiconductor body, epitaxially growing from the vapor phase a third monocrystalline region of a second semiconductor having a wider band gap from said first semiconductor and of opposite conductivity type onto said one surface of said body intermediate said two spaced contacts and defining with said body a heterojunction whereby an inversion layer is created at the interface of said first and second semiconductor materials to define with said two spaced contacts an ohmic conduction path of opposite conductivity type to said body.

References Cited by the Examiner

UNITED STATES PATENTS

| | | | |
|---|---|---|---|
| 2,764,642 | 9/1956 | Shockley | 317—235 |
| 2,900,531 | 8/1959 | Wallmark | 317—235 |
| 3,072,507 | 1/1963 | Anderson | 317—235 |
| 3,102,230 | 8/1963 | Kahng | 317—235 |
| 3,176,153 | 3/1965 | Bejat | 317—235 |

OTHER REFERENCES

IBM Technical Disclosure Bulletin, vol. 3, No. 2, July 1960, p. 44.

JOHN W. HUCKERT, *Primary Examiner.*

J. D. KALLAM, *Assistant Examiner.*